Figure 1:
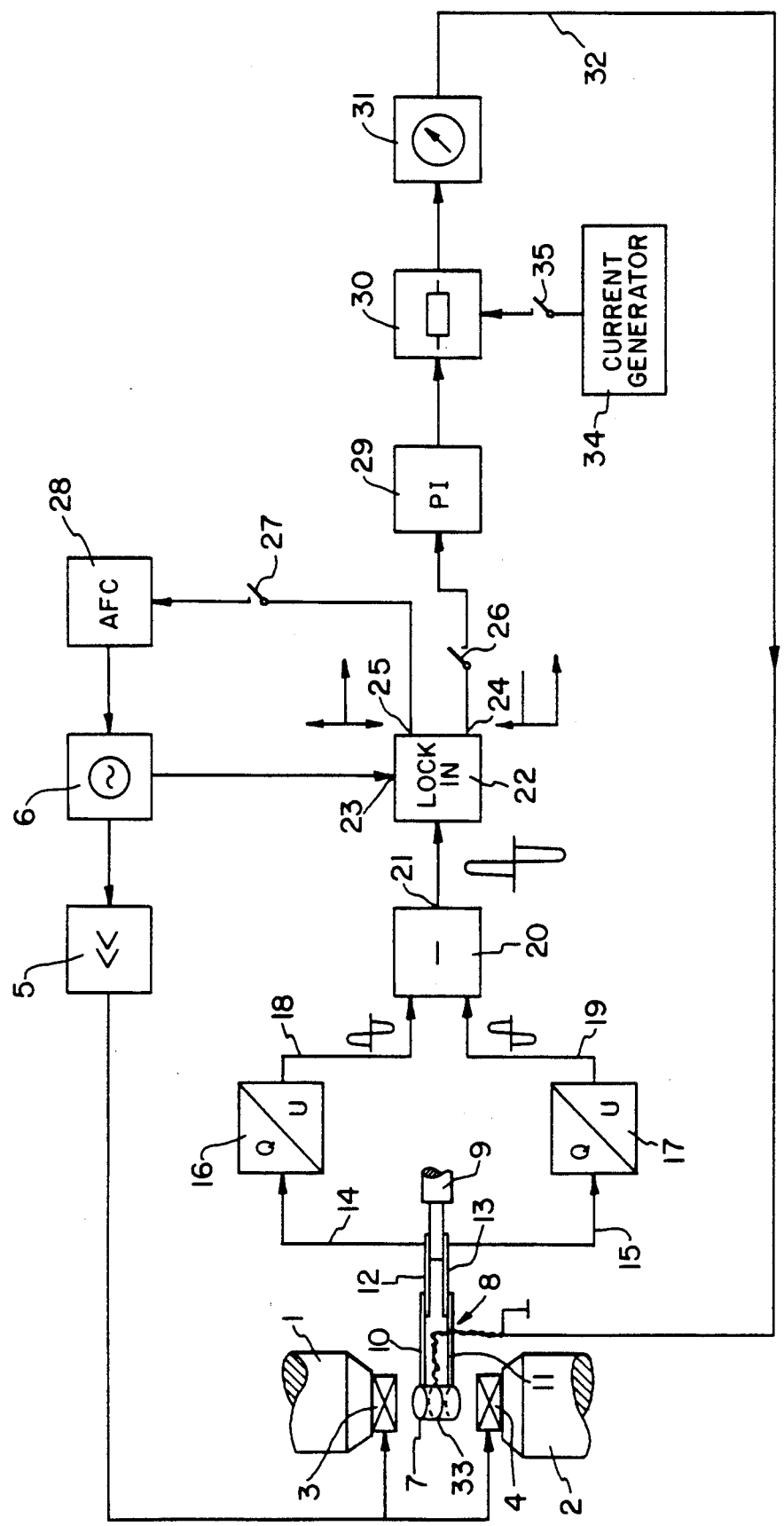

United States Patent [19]

Frey et al.

[11] Patent Number: 5,001,426
[45] Date of Patent: Mar. 19, 1991

[54] MAGNETOMETER FOR MEASURING THE MAGNETIC MOMENT OF A SPECIMEN

[75] Inventors: Thomas Frey, Ketsch; Wolfgang Jantz, March; Rudolf Stibal, Freiburg, all of Fed. Rep. of Germany

[73] Assignee: Fraunhofer-Gesellschaft Zur Forderung Der Angewandten Forschung E.V., Munich, Fed. Rep. of Germany

[21] Appl. No.: 381,655
[22] PCT Filed: Aug. 31, 1988
[86] PCT No.: PCT/DE88/00532
§ 371 Date: Jun. 8, 1989
§ 102(e) Date: Jun. 8, 1989
[87] PCT Pub. No.: WO89/03535
PCT Pub. Date: Apr. 20, 1989

[30] Foreign Application Priority Data

Oct. 9, 1987 [DE] Fed. Rep. of Germany ....... 3734128

[51] Int. Cl.$^5$ ...................... G01R 33/02; G01R 33/00
[52] U.S. Cl. ..................................... 324/259; 324/260
[58] Field of Search ............... 324/200, 201, 226, 228, 324/244, 260-262, 256-259

[56] References Cited

U.S. PATENT DOCUMENTS 4,005,358 1/1977 Foner ................................ 324/222

FOREIGN PATENT DOCUMENTS 2341088 8/1973 Fed. Rep. of Germany.

OTHER PUBLICATIONS

Tatigkeitsbericht IAF 1984, pp. 135–137.
Zeitschriftangenwandte Physik 26. Bd. Heft 1, 1969, pp. 84–87, W. Hellenthal and U. Lotter.
Roos et al, "High Sensitivity Vibrating Reed Magnetometer", Rev. Sci. Instrum. 51(5), 5/1980, pp. 612–613.
Balev et al, "Automated Magnetometer with Superconducting Solenoid", 8/64, Instruments and Experimental Techniques, May–Jun. 1985, No. 3, part 2, pp. 685–686.
"Thermal Conductivity at Very Low Temperatures", published by Jacob N. Haasbroek, Jun. 1971, pp. 44–45.

Primary Examiner—Walter E. Snow
Attorney, Agent, or Firm—Jeffers, Hoffman & Niewyk

[57] ABSTRACT

In a magnetometer with an inhomogeneous magnetic field which timewise changes in its intensity periodically and acts upon the specimen to be measured, the latter being attached to the free end of a tongue (8) that can be oscillated and whose oscillations can be determined by piezo elements (12, 13), there occurs a compensation of the magnetic moment of the specimen with the aid of a compensating current loop (33). The current required for arresting the oscillations is a measure of the magnetic moment to be determined. An adaptation to the resonance frequency of the oscillating tongue (8) is effected through a frequency control ciruict (22, 28, 6), making it possible to measure large temperature ranges at great sensitivity and contingent on temperature.

15 Claims, 4 Drawing Sheets

MAGNETOMETER FOR MEASURING THE MAGNETIC MOMENT OF A SPECIMEN

The invention concerns a magnetometer with an inhomogeneous magnetic field which timewise changes in its intensity periodically and acts on the sample to be measured, which sample is attached to the free end of a tongue that can be caused to oscillate and whose oscillations can be recorded by at least one piezo element connected with an evaluation circuit that features a measuring amplifier for acquisition of the amplitudes of the piezo signals, and features a low frequency generator which through a power amplifier is connected to a coil setup which generates the periodically changing magnetic field, with the sample being surrounded by a compensating current loop.

A magnetometer of that type, without compensating current loop, is described in "Review of Scientific Instruments" 51 (5), May 1980, pages 612, 613 and enables qualitative measurements of the magnetic moments of very small samples, by registering with the aid of a piezo element the oscillation amplitude of a tongue constructed from gold wire and a glass fiber. The output signal of the piezo element is fed to a phase-sensitive amplifier whose output signal represents the measuring signal.

The oscillation amplitude of the prior system, and thus the output signal, depend not only on the magnitude of the magnetic moment to be determined but also on the elasticity of the materials used the inertia of the oscillator and the magnitude as well as frequency of the field gradient Therefore, only qualitative measurements for microscopically small samples, without registering the temperature contingency of the magnetic moment, are possible with the prior magnetometer.

From the 1984 activities report of the Fraunhofer Institute for applied solid state physics, page 136, it is known that the piezo signals can be compensated for by the magnetic moment of a current loop. How this is to be accomplished in practice, however, does not derive from the activities report.

Basing on this prior art, the problem underlying the invention is to provide a magnetometer of the initially mentioned type which allows the performance of quantitative measurements of magnetic moments at various temperatures, also on samples having dimensions in the range of several millimeters.

This problem is inventionally solved in that the low frequency generator is activated by an automatic frequency control circuit by which the frequency of the magnetic field can be adjusted to the respective resonance frequency of the tongue, and in that the magnitude of the compensating direct current can be registered by the compensation current loop for the quantitative determination of the magnetic moment, at which compensating current the magnetic moment of the sample, and thus the excitation of the tongue, is compensated for.

Since a measurement takes place after the tongue oscillations have been zeroed, a quantitative determination of the magnetic moment of a sample is possible independently of the amplitude of the output signal of the measuring amplifier and thus independently of the system magnitudes which have an influence on the amplitude. By tuning the exciting frequency to the resonance frequency it is possible to measure magnetic moments across large temperature ranges at a very high sensitivity.

In a favorable embodiment of the invention, the sample is contained in a hollow cylinder from quartz whose longitudinal axis extends in the direction of the magnetic field between the two magnetic poles and on which a wire loop with a winding from a thin gold wire is applied as compensating current loop. The tongue to be oscillated with the hollow cylinder from quartz is housed in a tail part of a cryostat which protrudes into the gap between the two poles of the electromagnet generating the magnetic field.

The measuring amplifier is preferably a phase-sensitive amplifier with a first output for a first control circuit that contains the compensating current loop. A second output of the phase-sensitive amplifier for signals phase-shifted by 90° controls the input of a circuit for an automatic frequency control which is located in a second control circuit which makes it possible to tune the excitation frequency of the low frequency generator to the respective resonance frequency of the oscillation system.

Suitable developments and advancements of the invention are set forth in the subclaims.

An embodiment of the invention will be more fully explained hereafter with the aid of the drawings.

Figure 2:
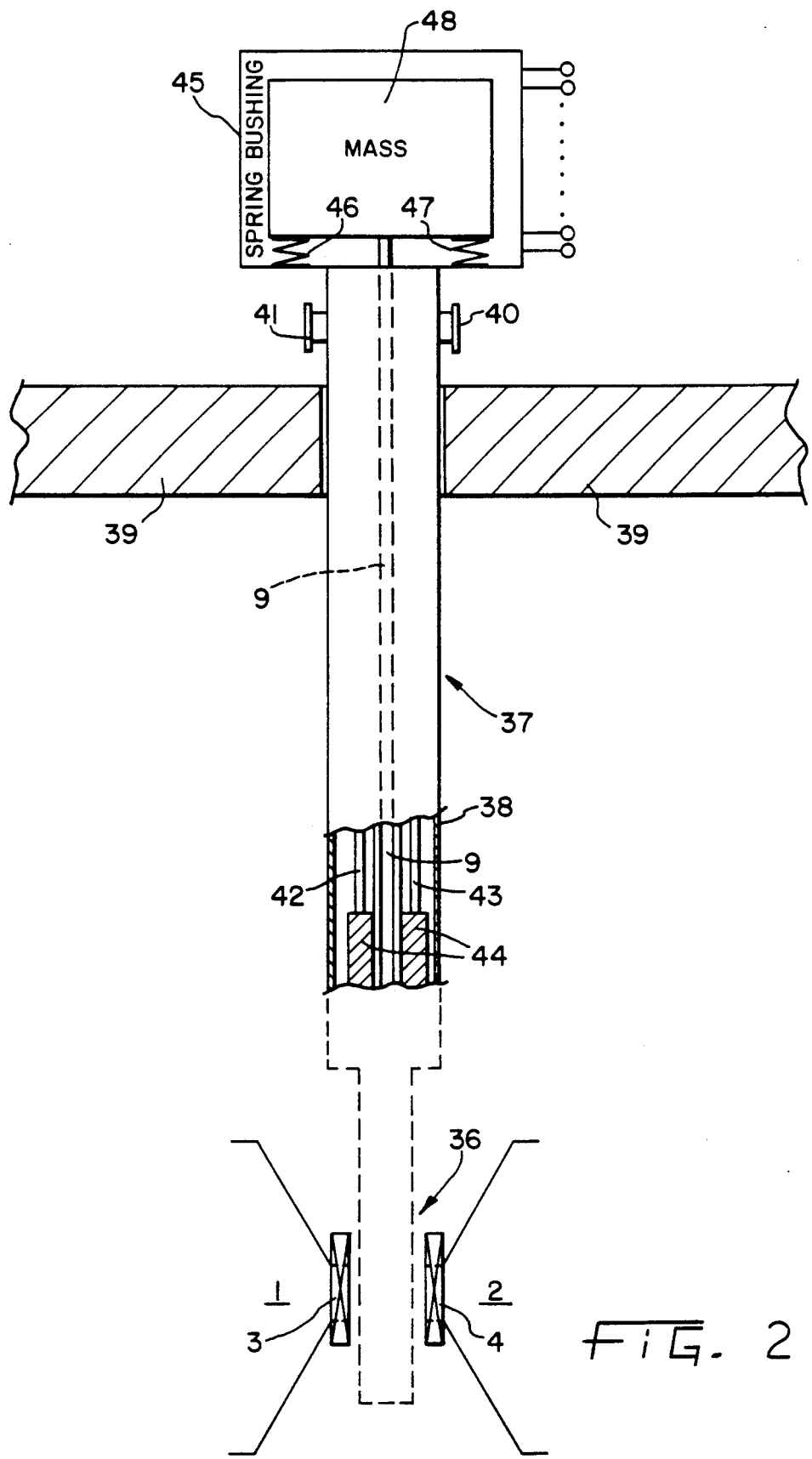
Figure 3:
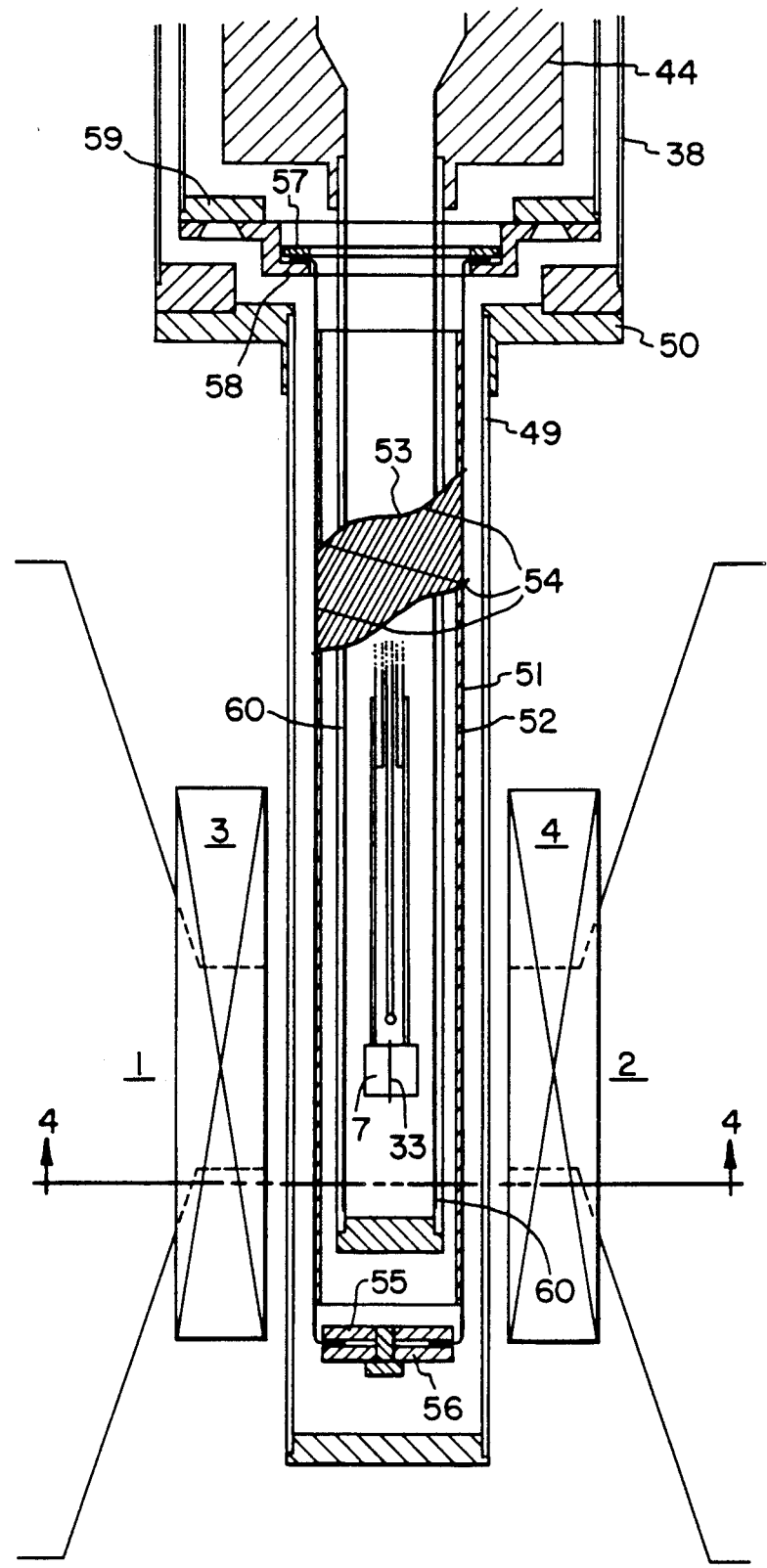
Figure 4:
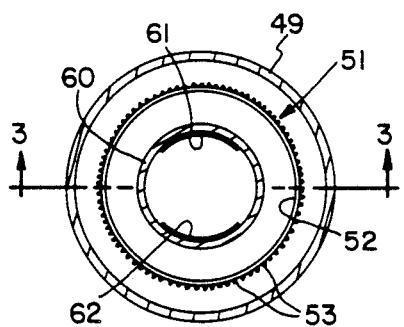
Figure 5:
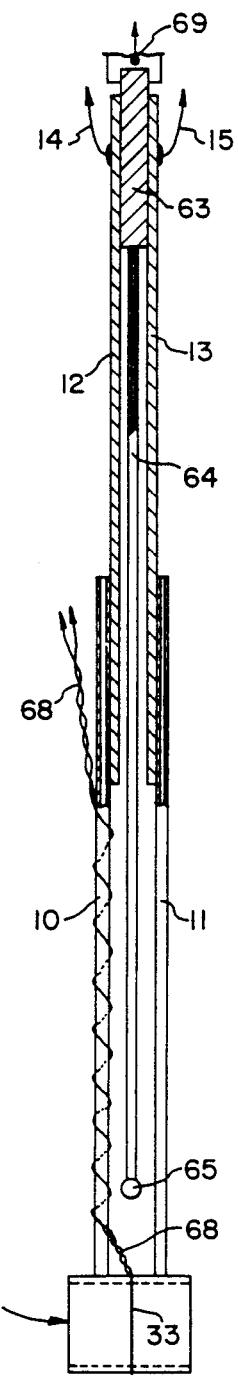
Figure 6:
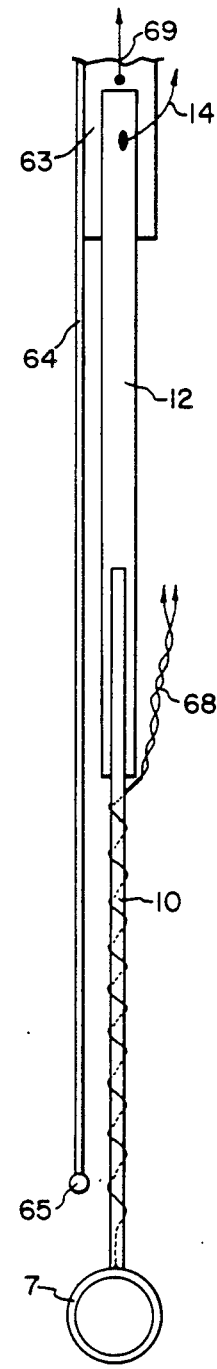

FIG. 1 shows schematically the inventional magnetometer together with a block diagram of the control circuits;

FIG. 2, the cryostat of the magnetometer in side elevation, partly cut away;

FIG. 3, a longitudinal section of the cryostat tail along line III—III in FIG. 4;

FIG. 4, a cross section of the cryostat tail along line IV—IV in FIG. 3;

FIG. 5, the tongue of the magnetic sensor in a partly cut-away side elevation, and FIG. 6, a view of the tongue of the magnetic sensor of the magnetometer in the oscillation direction of the tongue and quartz hollow cylinder of the magnetometer.

Illustrated schematically in FIG. 1 along with a block diagram of the electronic components, the magnetometer features an electromagnet with pole shoes 1, 2 on which gradient coils 3, 4 are arranged which in excited condition generate between the pole shoes 1, 2 a magnetic field gradient which timewise varies in its intensity, sinusoidally, according to the current supplied to the gradient coils 3, 4 by a low frequency amplifier 5. The low frequency amplifier 5 is connected with the output of a low frequency generator 6. The excitation frequency that can be generated by the low frequency generator 6 ranges between 10 and 100 Hz, so that the timewise varying magnetic field between the gradient coils 3 and 4 will oscillate at the same frequency.

Located halfway between the pole shoes 1, 2 is a hollow cylinder 7 from quartz serving as space for the specimen whose magnetic moment is to be determined quantitatively. Due to the magnetic field gradient, the sample mounted in the quartz hollow cylinder 7 is subjected to a force whose magnitude depends on the magnetic moment and the field gradient Due to the alternating current fed to the gradient coils 3, 4, a force which periodically changes in intensity and direction acts thus on the sample along the connecting line between the pole shoes 1 and 2.

The hollow cylinder 7 from quartz is fastened to the front, free end of the tongue 8 which due to the magnetic excitation is caused to oscillate while fixed on the end opposite the quartz hollow cylinder 7, by a rigid holding tube 9 from ceramic.

The tongue 8 consists of two quartz tubelets 10, 11 which are connected with the quartz hollow cylinder 7 and connected on the end opposite the quartz hollow cylinder 7 with reglets 12, 13 which consist of piezoceramic material and serve as piezo elements for registering the oscillating movements of the tongue 8.

The reglets 12, 13 that are effective as piezo elements are connected through lines 14, 15 with the input of charge/voltage converters 16, 17 in such a way that signals of opposite phase will be carried by the output lines 18, 19 as the tongue 8 oscillates.

The opposite-phase signals energize the two inputs of a subtracting stage 20, so that the opposite-phase signals will add and produce on the output 21 an output signal which is stronger as compared to the input signals, with equal-phase interference signals contained in the output lines 18, 19 being suppressed.

The output 21 is connected with the input of a phase-sensitive amplifier 22 (lock-in amplifier) which through a reference input 23 is connected with the low frequency generator 6 in order to make available to the phase-sensitive amplifier 22 the necessary reference frequency, which is identical with the excitation frequency of the tongue 8.

The phase-sensitive amplifier 22 features a first output 24 for a compensating current loop and a second output 25 input for signals phase-shifted by 90°. As the tongue 8 oscillates, the output 24 carries a direct voltage signal whose magnitude depends on the amplitude of the oscillations of the tongue 8 which, in turn, depends on the magnetic moment of the sample.

The first output 24 of the phase-sensitive amplifier 22 connects through a first switch 26 with a proportional-/integral member or proportional integrator 29. The second output 25 connects through a second switch 27 with an automatic frequency control circuit 28 that can be varied by way of the excitation frequency of the low frequency oscillator 6.

When the second switch 27 is closed while the first switch 26 is opened, a closed control circuit results that tunes the excitation frequency to the resonance frequency of the magnetic sensor which includes the tongue 8. Depending on the specimen mass and the temperature, e.g., the reference frequency ranges between 40 and 80 Hz. The occurrence of a resonance causes a maximum deflection of the tongue 8, and the amplitude reaches on the first output 24 a maximum. The signal on the second output 25, contrarily, is zero at balanced phase position. When a change of the resonance condition of the magnetic sensor with the tongue 8 occurs, for instance due to temperature change, a change of the phase relationship between the excitation and the oscillation of the tongue will result, expressing itself as a signal on the second output 25 which differs from zero and is positive or negative, depending on the direction of variation. With the second switch 27 closed, this signal proceeds to the automatic frequency control circuit 28 which continues to tune in on the excitation frequency of the low frequency oscillator 6, in the direction given by the respective sign of the signal, until the original phase relationship and thus the resonance between the excitation frequency and the natural frequency of the magnetic sensor is restored.

By tuning the excitation frequency to the resonant frequency and alternately actuating the first switch 26 for measuring the magnetic moment in the manner described hereafter, and actuating the second switch 27 for tuning to the resonance conditions of the magnetic sensor it is possible to measure magnetic moments of the sample at very high sensitivity and contingent on temperature, across large temperature ranges, for instance from 5 to 350 K.

The proportional/integral member 29 connected with the first switch 26 energizes a current actuator or current source whose output is a function of the input voltage, 30 whose current can be measured by a current measuring device 31 and which through a line 32 energizes a wire loop 33 with a compensating current, which loop is wound about the outside of the quartz hollow cylinder 7. The magnetic moment generated by the wire loop 33 causes at the selected winding and current direction a compensation of the alternating force acting on the tongue 8 of the magnetic sensor, due to the compensation of the magnetic moment of the specimen. The oscillation amplitude of the quartz hollow cylinder 7 decreases as the compensation increases, and at complete compensation there occurs no longer any deflection of the tongue 8 and the direct voltage signal on the output 24 will be zero. The mutual dependency of the signal on the output 24 and the compensating current through the wire loop 33 defines a closed control circuit which through zero detection of the signal on the output 24 and of an electric compensating current through the wire loop 33 serves to compensate for the forces on the magnetic sensor with the tongue 8 and to tune the deflection to zero.

Upon zeroing of the signal on the output 24, in the off-condition of the control circuit, the magnetic moment of a sample in the sample space can thus be determined solely by measurement of the electric current through the wire loop 33 around the sample space and the geometric dimensions of the loop. To that end, the magnetic moment of the empty specimen holder, as far as it interacts with the field gradient, needs to be determined by a blank measurement and subtracted from the sum moment.

The measuring setup described above allows the quantitative determination of the magnetic moment of a specimen irrespective of variables which influence the amplitude, since the measurement takes place through zero adjustment.

Coordinated with the current actuator 30 is a generator 34 that can be connected with the current actuator 30 through a third switch 35 in order to perform the mentioned compensating operation alternatively and manually by an operator action without making use of the normally closed control circuit comprising the phase-sensitive amplifier 22 and the proportional/integral member 29, by supply of an electric voltage, by closing the third switch 35 while the first switch 26 is open, or, alternatively to generate another magnetic moment.

The generator 34 serves in an alternative way to perform the compensation of the magnetic moment of the specimen by the magnetic moment of wire loop 33. Depending on the adjustment of the output of generator 34 a compensation or an additional magnetic moment can be achieved. The value of the additional magnetic moment is determined by making a calculation which uses the current, the number of turns and the diameter of the wire loop 33.

When switch 27 is closed the closed circuit for adjusting the resonance frequency is working. When switch 26 is open the closed circuit to compensate the mechanical movement of the specimen is not working automatically, but it is possible to make a compensation by closing switch 35 and by adjusting the output of generator 34 manually in such a way that the current through line 32 and the wire loop 33 generates a magnetic moment which compensates the magnetic moment of the specimen. By taking into account the current measured by current measuring device 31 it is easy to calculate the magnetic moment generated by the wire loop 33 using the current and the diameter of the wire loop and the number of turns of that coil.

The actuation of the switches 26, 27, 35 and the reading of the current value from the current measuring device 31 can be effected through a computer not illustrated in the drawing, enabling an automatic operation of the magnetometer.

The magnetic sensor illustrated in FIG. 1 in the area of the pole shoes 1, 2 is located in the tail part 36 of a cryostat 37 that can be seen in FIG. 2 and may be fashioned as a helium flow cryostat. From FIG. 2 it is evident how the tail part 36 protrudes into the gap between the pole shoes 1, 2 with the gradient coils 3, 4. The cryostat 37 features a cryostat external tube 38 which is firmly connected with a concrete plate 39 resting on air cushions not illustrated in the drawing. Visible above the concrete plate 39, in FIG. 2, is a coolant inlet socket 40 and a coolant outlet socket 41 which through coolant lines 42, 43 are connected with a heat exchanger 44 which is located above the tail part 36, in the lower section of the cryostat external tube 38.

Contained on the upper end of the cryostat external tube 38 is a spring bushing 45 with a dual-stage spring system, symbolically illustrated by springs 46, 47, for low-vibration mounting of a heavy mass 48 to which the holding tube 9 described in conjunction with FIG. 1 is attached, which supports the magnetic sensor arranged in the tail part 36.

FIG. 3 depicts an enlarged cross section of the tail part 36 of the cryostat 37, for illustration of further detail. Previously mentioned components are marked using the same reference symbols as in FIGS. 1 and 2.

As can be seen from FIG. 3, the tail part 36 of the cryostat 37 consists of an external tube 49 which is connected with the bottom end of the cryostat external tube 38 by way of flange parts 50. Contained inside the external tube 49 from fiber-reinforced plastic is a thermal shielding tube 51 which by its construction prevents the occurrence of eddy currents that would be created by the gradient coils 3, 4 in a metal tube and would cause vibrations in the cryostat and affect the magnetic sensor. The thermal shielding tube 51 consists of a thin-walled tube 52, for instance from plexiglas which together with the tubes of the tail part 36 is illustrated, in FIG. 4, in cross section and surrounded by a layer of densely packed enameled copper wires 53 with a diameter of, e.g., 0.55 mm which at a slight helix extend along the longitudinal axis of the tube 52 in the way illustrated in FIG. 3, as a section. The layer of copper wires 53 is lapped with a thread 54 that extends approximately at a right angle to the copper wires 53.

The bottom ends of the copper wires 53 are radially bent inward by 90° and clamped between two screw-tightened teflon disks 55, 56. The upper ends of the copper wires 53 are tightened between a clamping ring 57 and a flange ring 58 by way of which the shielding tube 51 is mounted on the coordinated flange 59 of the cryostat 37. This arrangement, for one, assures the necessary thermal conductivity along the entire length of the shielding tube 51 and, for another, prevents electrical current paths though with diameters that are greater than the diameter of the mutually insulated wires.

Contained inside the shielding tube 51, as can be seen from FIGS. 3 and 4, is a cryostat internal tube 60 that consists as well from glass fiber-reinforced plastic. The cryostat internal tube 60 is filled with helium gas pressurized to about 10 mbars. Extending inside the cryostat internal tube 60 are two copper troughs 61, 62 which serve as a cooling tube and are thermally well connected with the heat exchanger 44 of the cryostat. The shape of the copper troughs 61, 62 can be seen clearly from the cross section illustrated in FIG. 4. The alignment of the longitudinal gap formed between the copper troughs 61, 62 is parallel to the drawing plane in FIG. 3, and thus along the field lines between the pole shoes 1, 2 of the electromagnet.

FIGS. 5 and 6, greatly enlarged, depict the magnetic sensor arranged inside the cryostat internal tube 60, which is illustrated in FIGS. 1 and 3.

Visible in FIG. 5 is the bottom end of the holding rod 9, which is fashioned as a flattened ceramic transition piece 63. Reglets 12, 13 are glued with their upper ends on the flattened ceramic transition piece 63. Additionally, a thermal sensor tubelet 64 from quartz, for accommodating a thermal sensor 65, is attached to the ceramic transition piece 63. The reglets 12, 13 consist of piezo ceramic material and measure, e.g., 70 mm by 1.6 mm×0.65 mm. Provided on their broadsides with silver electrodes, the reglets 12, 13 have attached to them, in the area of their bottom ends, the quartz tubelets 10, 11, their outside diameter amounting to 1 mm and their inside diameter to 0.7 mm. The quartz tubelets 10, 11 extend up to the outside wall of the quartz hollow cylinder 7 which serves to hold the specimen to be measured and has an inside diameter of, e.g., 6 mm. FIG. 5 clearly depicts the wire loop 33 which is applied on the outside wall of the quartz hollow cylinder 7 and the twisted leads 68 of which are run along the quartz tubelet 10. Both the wire loop 33 and the twisted lead 68 consist of enameled gold wire measuring 0.05 mm in diameter.

The silver electrodes applied on the broadsides of the piezoelectric reglets 12, 13 and serving to tap the charges generated in the bending due to the piezoelectric effect are connected with the lines 14, 15 and a common line 69 for the internal silver electrodes, which carry the same potential. The tongue 8 illustrated in FIGS. 5 and 6, representing the oscillating part of the magnetic sensor, is about 10 cm long.

We claim:

1. Magnetometer with an inhomogeneous magnetic field which periodically changes in intensity and which acts upon a specimen to be measured, the specimen attached thereto, the magnetometer comprising:
    an oscillatable tongue having a piezo element for sensing the tongue oscillations and for producing piezo signals in response thereto;
    an evaluation circuit connected to said piezo element, said evaluation circuit includes a measuring amplifier for measuring the amplitudes of said piezo signals;
    a low frequency generator connected to said measuring amplifier;
    a power amplifier connected to said low frequency generator;
    a plurality of coils disposed around said oscillatable tongue, said coils connected to said power amplifier, and adapted to generate a periodically changing magnetic field;

a compensating current loop for surrounding the specimen connected to said oscillatable tongue characterized in that the low frequency generator is activated by an automatic frequency control circuit for adjusting the frequency of the magnetic field to the resonance frequency of the tongue;

means for comparing the low frequency generator output to said piezo signals and for generating a direct current signal; and means for measuring the magnitude of the direct current through the compensating current loop.

2. Magnetometer according to claim 1, characterized in that the measuring amplifier is a phase-sensitive amplifier having a first output signal for energizing the compensating current loop.

3. Magnetometer according to claim 2, characterized in that the phase-sensitive amplifier has a second output signal indicative of the phase shift of the low frequency generator output relative to the piezo signals, said second output signal being supplied to the automatic frequency control circuit.

4. Magnetometer according to claim 3, including first and second switches which are respectively connected to two output lines of said phase sensitive amplifier.

5. Magnetometer according to claim 1 including a second piezo element and wherein said two piezo elements are coupled to said tongue, said piezo elements connected in opposite phase to a charge/voltage converter, the piezo elements generating output signals of opposite phase as the tongue oscillates, said piezo output signals connected to a subtracting stage having an output signal which forms an input signal for said measuring amplifier.

6. Magnetometer according to claim 1 characterized in that the compensating current loop is actuated by a current measuring device and a current actuator whose input voltage is generated by a proportional/integral member which is connected with the output of the measuring amplifier.

7. Magnetometer according to claim 6, characterized in that the current actuator includes a second input for connecting to a direct voltage and for generation of an additional moment or for compensation of the force on said tongue.

8. Magnetometer according to claim 1 characterized in that the free end of the tongue includes a hollow cylinder for receiving a specimen to be measured, the circumference of said hollow cylinder surrounded by a compensating current loop made from electrically conductive material and having at least one winding turn.

9. Magnetometer according to claim 8, characterized in that the hollow cylinder is connected, through two quartz tubelets which extend generally parallel to each other, a plurality of strips of piezo ceramic material which extend generally parallel to each other and which are attached to the front end of a holding tube.

10. Magnetometer according to claim 9, characterized in that a thermal sensor tube extends parallel to the strips and the quartz tubelets, said thermal sensor tube including a thermal sensor which is disposed adjacent to the hollow cylinder.

11. Magnetometer according to claim 8 characterized in that the tongue is located in a tail part of a cryostat.

12. Magnetometer according to claim 11, characterized in that the tongue is arranged inside a cryostat internal tube which includes two radially opposed cooling troughs.

13. Magnetometer according to claim 12, characterized in that a thermal shielding tube is arranged between the cryostat internal tube and a cryostat external tube.

14. Magnetometer according to claim 13, characterized in that the thermal shielding tube is a thin-walled electrically conductive tube on which a plurality of insulated copper wires are helically wound.

15. Magnetometer according to claim 14, characterized in that the ends of he copper wires, which are adjacent the inside wall of the electrically conductive tube, are bent over at 90°, are clamped between two disks or rings, and are electrically insulated from one another.

* * * * *